United States Patent [19]

Peil et al.

[11] 3,731,215

[45] May 1, 1973

[54] AMPLIFIER OF CONTROLLABLE GAIN

[75] Inventors: William Peil, North Syracuse; Joseph P. Hesler, Liverpool, both of N.Y.

[73] Assignee: General Electric Company, Syracuse, N.Y.

[22] Filed: Aug. 6, 1971

[21] Appl. No.: 169,642

[52] U.S. Cl. ....................330/29, 330/30 D, 330/145
[51] Int. Cl. ..............................................H03g 3/30
[58] Field of Search ....................330/29, 30 R, 30 D, 330/69, 145; 325/319, 413

[56] References Cited

UNITED STATES PATENTS

| | | | |
|---|---|---|---|
| 3,538,448 | 11/1970 | Harford | 330/29 |
| 3,491,307 | 1/1970 | Solomon et al. | 330/30 D |

FOREIGN PATENTS OR APPLICATIONS

| | | | |
|---|---|---|---|
| 952,249 | 3/1964 | Great Britain | 330/29 |

OTHER PUBLICATIONS

Towers, "Balanced Transistor D.C. Amplifiers," Wireless World, August 1968, pp. 269–274.

*Primary Examiner*—Roy Lake
*Assistant Examiner*—James B. Mullins
*Attorney*—Richard V. Lang et al.

[57] ABSTRACT

An amplifier of controllable gain which is d.c. coupled throughout and capable of wide band operation is described. It employs a first and a second differential amplifier for producing the principal voltage gain of the amplifier. The differential amplifiers are interspersed with paired buffer amplifiers in emitter follower configuration, and a d.c. feedback path is provided to correct for any d.c. offset. Control of the gain of the first differential amplifier is implemented by an impedance connected in series with the base leads of the transistors and control of the collector emitter voltage to provide "forward" gain control operation. Control of the gain of the second differential amplifier is implemented by control of the emitter currents and by insertion in the emitter leads of a nonlinear impedance comprising a diode and a shunt resistance. The amplifier is of high gain and wide bandwidth and is suitable for amplification at intermediate frequencies (44 megahertz) of a television signal. The gain control range equals the forward gain of the amplifier. The circuit is adapted for integrated circuit fabrication.

12 Claims, 2 Drawing Figures

AMPLIFIER OF CONTROLLABLE GAIN

BACKGROUND OF THE INVENTION

1. Field of the Invention

The present invention relates to d.c. coupled amplifiers capable of wide band operation and more particularly to an amplifier of electrically controllable gain. The amplifier is adapted for amplification of a television signal at customary intermediate frequencies, with the amplification being subject to control as a function of the signal level in a subsequent detection stage. The amplifier is compatible with integrated circuit fabrication techniques.

2. Description of the Prior Art

In a conventional television receiver, the amplification of a television signal occurs at a typical "intermediate" frequency of 44 megahertz. Amplification has normally been achieved by a succession of tuned amplifier stages, each stage operating with a.c. coupling between the stages, the coupling being tuned to permit amplification of only a narrow band of signals. With the advent of integrated circuit technology, it has been particularly desirable to avoid the periodic insertion of filtering, which could not be integrated, between stages of amplification, which could be integrated. This has lead to the suggestion to establish the requisite filtering in a "lump" off the chip and the gain on another "lump" on the chip. Within the chip, a.c. coupling, whether broadband or narrow, has been less desirable than d.c. coupling.

Thus, with the advent of integrated circuits, it became desirable to develop d.c. coupled amplifiers for tasks previously assigned to a.c. amplifiers. The customary requirements of such a.c. amplifiers have not been met by existent d.c. amplifiers. Assuming that a d.c. amplifier will be employed for the amplification of the relatively high frequency signals in a television IF amplifier, one must provide the necessary high frequency response, amplification linearity, balance, noise figure and automatic gain control features that this application requires.

SUMMARY OF THE INVENTION

It is a principal object of the invention to provide an amplifier having improved gain control action.

It is another object of the invention to provide a differential amplifier having improved gain control action.

It is still another object of the invention to provide a d.c. coupled amplifier having a high frequency response and a wide range of gain control action.

It is still a further object of the invention to provide an amplifier suitable for integrated circuit fabrication having improved gain control action.

It is still another object of the invention to provide a d.c. coupled amplifier suitable for use as the gain element in an intermediate frequency amplifier of a television receiver.

These and other objects of the invention are achieved in a combination comprising a pair of transistors each having base, emitter and collector electrodes connected in differential amplifier configuration, the transistors presenting a characteristic input impedance to signals differentially coupled to said bases, which input impedance is a decreasing function of the collector emitter voltage, a pair of resistances having a value comparable to this input impedance and connected in the signal path of each base for producing a division in the input signal between the resistances and the input impedance of the transistors. Means are provided to adjust the collector emitter voltage to alter the signal division ratio between the resistances and the input impedance and thereby control the gain of the differential amplifier. The external resistance is set to a value intermediate between the maximum and minimum input impedance of the transistors, which provides an acceptable input noise figure for the amplifier at maximum gain. A constant current source is provided in the emitter leads.

In accordance with additional aspects of the invention a pair of buffer amplifiers is provided whose emitters are coupled to the respective input electrodes of the differential amplifier and whose bases are coupled to a common mode control voltage. An additional pair of transistors in differential amplifier configuration is also provided, the output signal of the first differential amplifier being connected in push-pull to the bases of said additional transistor pair, and feedback means are provided including a low pass filter network coupled to the collectors of the additional transistor pair for d.c. coupling a filtered output signal to the bases of the buffer amplifiers to compensate for d.c. offset in amplification. The additional transistor pair is preferably of a conductivity type complementary to that of said first transistor pair and its emitters are coupled to a controllable constant current source which is returned to a potential elevated with respect to potential at the base electrodes of said first transistor pair. When an increase in current is produced by this controllable constant current source, it produces an increasing common mode potential at the collectors of the additional transistor pair, forcing a corresponding increase in the common mode base potentials of the transistors of the buffer amplifier and of said first transistor pair which reduces the collector emitter voltage and thereby the gain of the first transistor pair.

In accordance with another aspect of the invention, a further differential amplifier is provided, which is subject to gain control action by emitter current reduction, the gain control action being augmented by the provision of a pair of nonlinear degenerative impedances in the emitter leads of the component transistors. This arrangement thus provides gain control of this last named differential amplifier together with forward gain control of the first differential amplifier.

In accordance with a further aspect of the invention, additional buffer amplifiers are provided before and after the further differential amplifier pair so as to maintain a generally flat gain versus frequency response in the overall amplifier.

BRIEF DESCRIPTION OF THE DRAWING

The novel and distinctive features of the invention are set forth in the claims appended to the present application. The invention itself, however, together with the further objects and advantages thereof may be best understood by reference to the following description and accompanying drawings in which:

DESCRIPTION OF THE PREFERRED EMBODIMENT

Figures 1, 2:
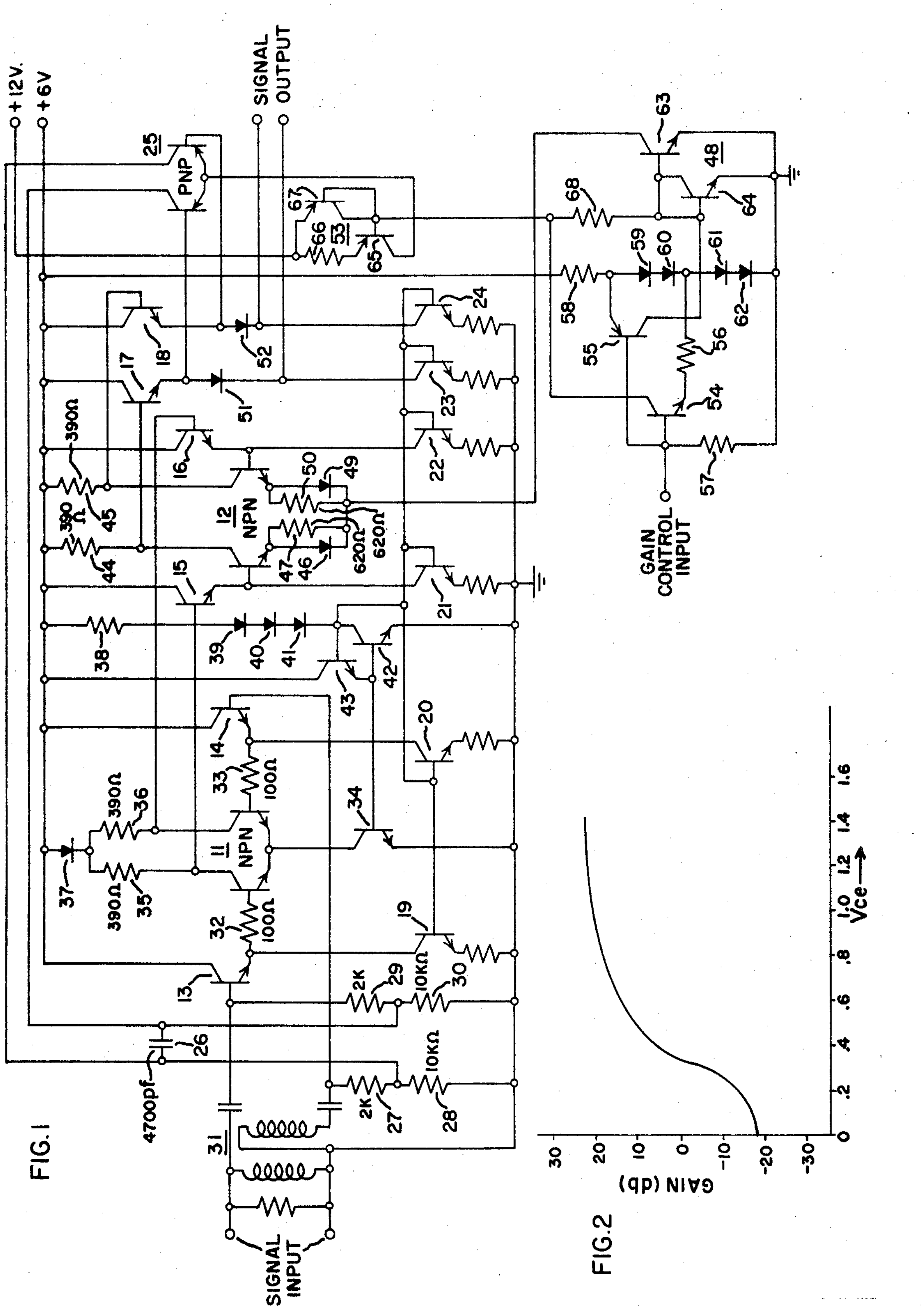
FIG. 1 is a circuit diagram of an amplifier in accordance with the invention, which is of controllable gain and suitable for use as the amplifier of a television signal at customary intermediate frequencies.
FIG. 2 is a graph of the effect upon gain in the first stage of the amplifier of a variation in the collector emitter voltage.

Referring now to FIG. 1, a circuit diagram is provided of a d.c. amplifier in accordance with the invention employed as an intermediate frequency amplifier for a television receiver. This intermediate frequency amplifier differs from conventional IF amplifiers for television receivers in that the filtering is achieved by a lumped filter containing all the IF selectivity prior to the amplifier. The amplifier itself passes all the components of a selected television channel without appreciable relative attenuation. The IF amplifier may be used to supply an amplified signal to a suitable video detector. The amplifier has balanced input connections, balanced output connections and a balanced d.c. interstage signal coupling throughout.

The amplifier consists of two differential amplifier stages 11 and 12 supplemented by three pairs of buffer amplifiers 13–14, 15–16, 17–18, current supply elements 19–24, a feedback network comprising the components 25–30 and an automatic gain control network.

A balanced input to the amplifier is obtained from the IF filter by means of a "balun" 31. The balun may take the form of a coil having two matched bifilar windings. Connections to the windings are made by a pair of ungrounded terminals and a ground connection. When an input signal is applied between one ungrounded terminal and ground, causing signal voltage across one winding, an equal signal voltage is induced in the other winding, producing at the other ungrounded terminal a corresponding signal, which is of equal magnitude but out of phase. The balun produces an output signal, which is balanced to ground. The balanced signal is coupled from the balun 83 through a pair of coupling capacitors to the transistor bases of the first pair of buffer amplifiers 13, 14. From this point on, the amplifier employs only d.c. signal coupling.

The paired buffer amplifiers 13, 14 are emitter followers having their collectors directly connected to a 6 volt source of bias potentials and their emitters, from which a balanced output signal is derived, connected, respectively, to current sources 19, 20. The output signal taken from the emitters of buffer amplifiers 13, 14 is then fed through a pair of degenerating resistances 32, 33 to the balanced signal input connections of the first differential amplifier 11.

The first differential amplifier 11 consists of two transistors having their emitters connected in common to the collector of a current source transistor 34; having their bases connected to the resistances 32, 33 for the input signal connection; their collectors, from which the balanced output is derived, coupled through suitable load resistances 35, 36; and series diode 37 to the 6 volt source of positive bias potentials.

The current sources 19 through 24 are conventional for integrated circuit fabrication and are arranged to be disposed in the emitter leads of the individual emitter follower buffer amplifiers. Each current source comprises a transistor whose collector is connected to the emitter of the stage being controlled and whose emitter is grounded through a resistance. The bases of the current source transistors are connected to a common point on a voltage divider network for establishing a pre-assigned current operating point for each controlled stage.

Stabilization of the voltage at the input junction of the current source transistors is provided by a network comprising a resistance 38, three voltage dropping diodes, 39, 40, 41, which also provide temperature compensating action to the network, and two transistors 42, 43. The elements 38–41 are serially connected between the 6 volt source and the collector of the transistor 42, whose emitter is grounded. The transistor 43 has its collector connected to the 6 volt source, its emitter connected to the base of transistors 34 and 42, and its base connected to the collector of transistor 42. By this means, the bases of the constant current sources are established at approximately two diode drops above ground potential and the current is fixed in these current sources as a function of that voltage and their respective emitter resistances.

The current source transistor 34 for the differential amplifier 11 has its base connected with the base of transistor 42 so that the $V_{eb}$ of both is set at the same value, and in consequence the "constant" current in the differential amplifier 11 is also set.

Following the first differential amplifier 11, a second pair of buffer amplifiers 15, 16 is provided for coupling the balanced output signal from the first differential amplifier 11 to the second differential amplifier 12. The buffer amplifiers 15, 16 consist of two transistors connected in emitter follower configuration. Their bases are connected to the output collectors of differential amplifier 11, their collectors are directly connected to a source of bias potentials, and their emitters, from which a balanced input into the second differential amplifier 12 is obtained, are connected to current sources 21, 22.

The second differential amplifier 12 is similar in several respects to the first differential amplifier. It consists of two differentially connected transistors each having their bases connected to the output of the buffer amplifiers 15, 16 and their collectors, from which a balanced output signal is applied to output buffer amplifiers 17, 18, coupled through suitable load resistances 44, 45 to a source of bias potentials. Their emitters are separated, however. One emitter is led through forwardly biased diode 46, shunted by resistance 47 to controllable current source 48. Similarly, the other emitter is led through forward biased diode 49, shunted by resistance 50 to the same current source 48.

The current source 48, in a manner distinguishing the operation of differential amplifier 12 from differential amplifier 11, is subject to gain control by a variable d.c. voltage, normally derived from a subsequent detection stage and reflecting the a.c. signal levels.

The third pair of buffer amplifiers 17, 18 couple the balanced output signal from the second differential amplifier 12 through voltage dropping diodes 51, 52 to the signal output terminals.

The d.c. feedback network comprising the elements 25–30 maintains a low d.c. offset in the amplifier output leads through a negative differential feedback connection. The feedback network comprises a PNP differential amplifier 25 of high gain at low frequencies having its bases connected to the respective output emitters of buffers 17 and 18 and its emitters jointly connected to the current source 53. The PNP collectors are direct coupled back to the input of the amplifier through two pairs of serially connected resistances 29, 30 and 27, 28. The respective resistance pairs are connected between the bases of the input buffers 13 and 14 and ground, with the output connections from the amplifier 25 being made to the respective common connection points between the paired resistances. A by-pass capacitor 26 is coupled across the two feedback lines at the output collectors of amplifier 25.

The signal existing at the output of the differential amplifier 12 consists of three components: a common mode d.c. level component resulting from the gain control action on the amplifier 12 current source 63; a d.c. component of the differential output signal; and last, the balanced a.c. output signal of interest. The common mode d.c. output is blocked from the feedback loop by the common mode rejection of the PNP differential amplifier 25. The d.c. component of the differential output is a measure of amplifier offset and this signal is fed back to stabilize the amplifier and minimize the offset voltage at the output. The balanced a.c. output signal, if fed back to the input, would affect the amplifier a.c. gain and adversely affect amplifier stability. AC feedback is generally removed from the feedback loop by the low pass filter action of capacitor 26 in conjunction with the feedback resistors 27–30. Control of the current source 53 establishes the d.c. common mode signal at the output of amplifier 25. This signal in turn determines the d.c. bias point of the input buffers 13 and 14 and the first differential amplifier 11 through the feedback network 27–30.

It is important to maintain a low d.c. offset in the output leads. If the amplifier 25 were not present, the loop gain for d.c. biasing ($\mu\beta$) would become too low under maximum gain control conditions to maintain effective feedback and insure a low offset voltage. With the present arrangement, a minimum of approximately 30 db of differential d.c. feedback is present as a result of the gain in amplifier 25.

In addition, if amplifier 25 were not present, the offset reference would be the balance of the input arrangement in amplifier 11 which is driven during gain control action from linear to saturated operating regions. Balanced tracking under these severe changes in dynamic operating condition is very difficult to achieve. Amplifier 25 on the other hand operates in the linear region with small dynamic range requirements and can much more easily act as an accurate reference.

The differential amplifiers 11, 12 provide the voltage gain of the intermediate frequency amplifier, each having approximately 30 db of gain. The buffer amplifiers 13, 14, 15, 16, 17, 18 serve the primary function of buffering the individual differential amplifiers by providing a high input impedance and low output impedance. They do not directly contribute to the voltage gain of the amplifier. The purpose of this arrangement is to keep the gain essentially flat from the lowest frequencies to the higher limits (46 mc in a practical case). If there is appreciably more gain at lower frequencies, then low frequency noise may be objectionable. In the application of the present invention to a TV IF amplifier, where band shaping between each gain stage is avoided to reduce the need for continually going on and off an integrated chip, control of all out of band gain is an additional desideratum. Introducing emitter followers between gain stages prevents the decreasing input impedance (which decreases with increasing frequency) from appearing across the resistive loads in the output of the previous stage, thus keeping the gain flat over an extended range.

The gain of the amplifier is subject to two modes of control. The operating currents of the transistors in the differential amplifiers 11 and 12 and the buffer amplifiers 13 through 18 are controlled by the individual current sources previously listed which, except for the current source 48, are not subject to active gain control. These current sources set the operating points and thus fix the gain that is made subject to gain control action. The amplifier provides a total gain of approximately 60 db and means are provided for achieving approximately this range of control. The gain in the second differential amplifier 12 is initially reduced by reducing its quiescent current. The gain in the differential amplifier 11 is reduced by driving it into saturation. Thus, the gain reduction of the amplifier is achieved by "forward" gain control of the first stage and "reverse" gain control of the second stage.

The details of the gain control network and its operation will now be described. The gain control network comprises the first controllable current source 48 connected into the emitter paths of the differential amplifier 12 (and thereby controlling its gain), a second controllable current source 53 connected to control the emitter current in the differential amplifier 25 (and thereby controlling the gain of the differential amplifier 11), a resistance 68, and a gain control input network for control of the current sources 48 and 53 comprising the transistors 54, 55, resistances 56, 57, 58 and a diode series string comprising the diodes 59, 60, 61 and 62.

Taking up the controllable current sources, the constant current source 48 comprises a first transistor 63 having its emitter grounded and its collector connected to the emitter leads of the differential amplifier 12. Its base is connected to the collector and base of the diode connected transistor 64, the transistor 64 having its emitter grounded. Similarly, the constant current source 53 comprises a first transistor 65 having its collector connected to the emitters of the differential amplifier 25 and its emitter connected to a 12 volt positive source through a resistance 66. Its base is connected to the collector and base of the diode connected transistor 67, the latter having its emitter connected to the 12 volt positive source. It may be observed that the diode connected transistors 67 and 64 are series connected between the 12 volt positive bias source and ground and, while of complementary polarity, both are poled for easy current flow, the current path being completed by the resistance 68 connected between the respective collectors.

In the absence of a gain control voltage, an idling current flows in the current sources 48 and 53 establishing the minimum current for the PNP differential amplifier 25 and the maximum current for the differential amplifier 12. Increasing the gain control voltage decreases the amplifier gain from the value established by the quiescent conditions.

The current sources 48 and 53 are in turn subject to control by the input network comprising the transistors 55 and 54, respectively, and the elements 57 through 62. The gain control voltage is applied to the bases of the transistors 54 and 55 with the resistor 57 providing a ground return.

The elements 57 through 62 include a voltage dropping resistance 58 and four consecutive like poled diodes 59, 60, 61 and 62 all connected in series, the series circuit being coupled between the 6 volts positive source and ground. The transistor 55 has its collector connected to the base of the transistor 63 for control of current source 48. The emitter of transistor 55 is connected to the junction between the diode 59 and the resistance 58, thus placing its emitter some four diode voltage drops above ground. The transistor 54 similarly has its collector connected to the base of transistor 65 for control of current source 53. The emitter of transistor 54 is led through resistance 56 to the midpoint in the series diode string, thus giving its emitter an approximate voltage of two diode drops above ground potential.

The foregoing configuration sets the emitter voltages of the transistors 54, 55 at a point where at maximum gain and minimum control voltage on their respective bases, the transistor 55 is forwardly biased and transistor 54 is reversely biased.

The control sequence will now be described as the gain control voltage increases, bringing about a decrease in amplifier gain. At the lowest gain control voltage, the transistor 55 is forwardly biased completing a current path to the 6 volt positive source through resistance 58 and thereby supplying additional current to the current source 48. This current may be regarded as an addition to the current established by resistance 68 and diode connected transistors 64 and 67. At the same time, transistor 54 is reversely biased making a minimum contribution to the emitter current in amplifier 25. Under these conditions, differential amplifier 12 is operating at maximum gain and, as will be explained, differential amplifier 11 whose gain is dependent on the current applied to differential amplifier 25 is also operating at maximum gain.

As the gain control voltage increases, the transistor 55 gradually becomes less conductive until it is finally reverse biased, thereby cutting off its collector and eventually reducing the current supplied to the emitters of differential amplifier 12 to a minimum value. At the point of maximum gain reduction in 12, both control transistors 54 and 55 are normally turned off and differential amplifier 12 now has a minimum gain (while differential amplifier 11 continues to have maximum gain).

The gain control mechanism in the differential amplifier 12 operates as follows. As explained, the mechanism operates through a reduction in the common mode current supplied to the emitter in this amplifier. A reduction in emitter current produces a reduction in gain in amplifier 12 by virtue of the concurrent loss of transconductance ($g_m$).

The resistance-diode networks 46, 47, 49, 50 comprise a current actuated degenerative network which extends the natural gain reduction of amplifier 12 in the following manner. Under idling current conditions (maximum gain) diodes 46 and 49 are forwardly biased and provide a moderately low impedance path between the emitters of the differential amplifier 12. As this current is decreased by an increased gain control voltage, the diodes draw negligible current and the moderately high impedance of resistors 47 and 50 are introduced and represent an appreciable amount of emitter degeneration for the differential amplifier 62. This overall operation is usually characterized as reverse gain control.

The range of gain control of the stage 12 approximates or slightly exceeds the forward gain. Typically, the collector load resistances 44 and 45 are 390 ohms while the emitter connected resistances 47 and 49 are 620 ohms.

The value of resistors 47 and 49 is bounded by the following considerations. If the resistors are too small, diodes 46 and 49 will never conduct. If they are too large, the diodes will always conduct even under the minimum current condition dictated by the required output voltage swing. In a conventional integrated circuit application, the diodes 46 and 48 are diode connected transistors as generally illustrated at 64.

As the gain control voltage is further increased, the transistor 54 now becomes conductive. The resistor 56 connected in the emitter lead of 54 establishes the path by which collector current in transistor 54 increases the current supplied from current source 53 to the differential amplifier 25. As this current is increased, the collector current of the PNP transistors in 25 also increases and a reduction in gain in differential amplifier 11 is now brought about.

Gain control in the first stage is realized by driving the differential amplifier 11 into saturation. This is accomplished by increasing the current in amplifier 25 through its current source 53 and driving the common mode d.c. input voltage of amplifier 11 toward $B^+$ (+6 volts), thus reducing the $V_{ce}$ of the transistors in 11. The base connected resistors 32, 33 enhance the natural saturation gain reduction action of the amplifier 11 in the following way. Under idling conditions (maximum gain), the input impedance of amplifier 11 is high and resistors 32 and 33 represent a negligible series loss element. As amplifier 11 is driven into saturation by gain control, its input impedance lowers drastically and base resistors 32 and 33 become an appreciable series loss element.

In addition to the desired gain control action, the presence of resistors 32 and 33 tends to linearize the gain of the amplifier under conditions of high input signal levels by causing most of the input signal to appear across the degenerative resistors 32, 33.

Under typical operating conditions, the range of gain control in the amplifier 11 can substantially exceed the forward gain of the stage. Typically, the resistances 32 and 33 are small, being 100 ohms in one practical case. Assuming the beta ($\beta$) of the transistors to be approximately $j$ 20 and the series emitter resistance ($r_e$) to be 6 ohms, with the collector-emitter voltage ($V_{ce}$) exceeding a volt, the effective signal applied to the input of the differential amplifier is approximately 85 percent of the applied external signal, the effective product of $\beta r_e$ being approximately $j$ 180Ω. Normally the external base resistance should be selected to minimize gain and noise figure loss at the high gain bias point of the amplifier and the 100 ohms selected for the base resistances 32 and 33 is significantly smaller than the $j$ 180Ω $\beta r_e$ product of the transistors, and thus a suitable value.

When the $V_{ce}$ is reduced under the influence of the control network to a factor approaching zero but normally terminating in the region of 100–300 millivolts, the input impedance of the differential amplifier drops markedly with respect to the 100 ohm base resistors, partly as a result of reduced $\beta$ and partially because of the forward biasing of the collector base junction which provides a low impedance feedback network from input to output. The practical reduction in gain is observed to be approximately 40 db. FIG. 2 illustrates the resultant gain control characteristic in amplifier 11 as a function of collector-emitter voltage control.

Reduction of the gain is produced in the amplifier 11 of the illustrative embodiment by an elevation of the voltage applied to the base electrodes which reduces the collector-emitter voltage $V_{ce}$. One may also reduce the $V_{ce}$, and thereby the gain, by increasing the current in the amplifier 11. This would be done by increasing the emitter current supplied by the constant current source 34 as by removing the current stabilizing diodes 39, 40 and 41 and returning the base of transistor 43 to a gain control voltage source. Increasing the gain control voltage produces an increase in emitter current, inducing a corresponding increase in collector current in the transistors of 11, and an increased voltage drop in the collector load resistances 35 and 36, bringing about a reduction in $V_{ce}$. The current mode of $V_{ce}$ control is normally less satisfactory than the voltage control because of the restrictions it places on amplifier operation. If the transistor amplifier 11 is operating in a non-saturated mode, an initial increase in the emitter current will bring about an initial increase in the amplifier gain until gain reducing saturation occurs. This has the disadvantage of restricting the operation of the amplifier to a region close to saturation, and tends to make the illustrative embodiment preferable.

The foregoing combination in which the first amplification stage is provided with a forward gain control by a control of the collector emitter voltage and the second amplification stage is provided with a reverse gain control by control of the emitter current is particularly well suited to performing the gain control function in the intermediate frequency amplifier of a television receiver. Forward gain control in the first stage permits the first stage to operate in a low noise mode (with very little noise deterioration as a result of the base connected resistances) with a large dynamic range, with very low intermodulation, and with a large range of gain control (normally exceeding the forward gain of the stage). These advantages are essential in a first stage of an intermediate frequency amplifier. In the second stage adjustment of the gain by reverse AGC permits a larger signal output level than is possible with forward gain control. Using the reverse AGC in a simple form extends the range of gain control appreciably, while supplementing it by the use of the degenerative nonlinear impedances in the emitter leads provides the desired wide range of gain control approximating the forward gain.

The use of interstage emitter follower buffer amplifiers (13 through 18) between the two differential amplifier stages (11 and 12) is particularly advantageous in achieving wide band operation. The differential amplifiers 11 and 12 ordinarily have an upper frequency response of approximately 1 to 2 megahertz measured at the 6 db point. With the introduction of the emitter followers, the corresponding upper frequency response is in the vicinity of 50 megahertz, a very substantial improvement in high frequency response.

Since feedback is essential in the amplifier to provide a correction of any d.c. offset, the feedback loop must be present and it must not create instability. In the foregoing configuration, the filter network is a low pass filter having a time constant of approximately 25 microsec. High frequency instability is prevented by attenuating the feedback as the frequency increases, which reduces the feedback well below unity closed loop gain and provides unconditional stability quite irrespective of phase. This approach also assures stability under gain control action where phase variations are most likely to occur in the forward gain portion of the amplifier. Low frequency instability is avoided by allowing negative feedback at frequencies where negligible forward signal phase shift occurs in the amplifier.

The use of the PNP differential amplifier 25 permits amplifiers 11 and 12 to be subject to independent gain control. Without 25, and making a direct feedback connection for d.c. bias and control of the differential offset from the second stage to the first stage, one would introduce a common mode signal in the feedback loop as the second stage was subjected to gain control action. This hypothetical common mode signal would affect the gain control action on the first amplifier stage as the gain of the second stage was reduced, thus allowing both stages to undergo gain reduction together while only one was directly controlling. The PNP differential amplifier 25 removes the common mode signal from the feedback path while the differential feedback signal is passed. It thereby separates these feedback functions and permits independent control of the amplifiers.

If the foregoing amplifier is applied to the amplification of intermediate frequency signals in a television receiver, then it may be desirable for the initial gain reduction to occur in the second state (12) and the gain reduction in the first stage (11) to be delayed to retain a better IF noise figure for low level signals. Furthermore, when the television receiver has appreciable gain at input signal frequencies, it may be desirable to introduce an additional delay before the application of a gain control to the first IF stage while gain is removed from the tuner. In such a system, the first IF stage will then be the last stage to which gain control is applied. In practice, the delay may be achieved by reconnecting the emitter leads of the transistor 54 to a higher d.c. voltage, as for instance at the junction of diode 59 to resistance 58. This would provide approximately 1.5 volts of delay before the application of gain reduction to the first amplifier stage.

While gain control of the first stage has been achieved through the use of common mode currents applied to bases of transistors 13 and 14 through control of the emitter current in differential amplifier 25, gain control may also be achieved by eliminating stage 25 and applying the common mode signal to the center tap of the balun transformer 31, at the same time eliminating the capacitors from the base coupled leads and inserting a capacitor in the path from the center tap to ground. This arrangement is intended in situations where the other functions of stage 25 are not sought.

The amplifier which has been so far described is fully d.c. coupled throughout and will amplify a signal at television intermediate frequencies (44 meg.) in a balanced fashion. The amplifier is characterized by a highly symmetrical output and by an excellent phase response throughout the customary frequency spectrum. These relationships persist even in the presence of a high degree of automatic gain control. Furthermore, programming the gain control action in the manner indicated through successive stages, often including the tuner, holds the average sensitivity of gain control action to an approximately constant value. This property keeps the response time of the AGC loop constant for all gain settings and is helpful in reducing the detrimental effect of external influences such as airplane flutter.

What is claimed as new and desired to be secured by Letters Patent of the United States is:

1. An amplifier of controllable gain comprising:
   a. a pair of transistors each having base, emitter and collector electrodes connected in differential amplifier configuration, said transistors presenting a characteristic input impedance to signals differentially coupled to said bases, said input impedance decreasing as a function of the collector emitter voltage,
   b. a pair of resistances having a value which is comparable to said input impedance, one connected in the signal path to each base for producing a division in applied input signal between said resistance and the input impedance of said transistors, and
   c. means to adjust the collector emitter voltage to alter the ratio between said resistance and said input impedance and thereby control the gain of the said differential amplifier.

2. An amplifier as set forth in claim 1 wherein said resistance value is intermediate to the maximum and minimum input impedances of said transistors.

3. An amplifier as set forth in claim 2 wherein said resistance value is a fraction of said maximum impedance adjusted to provide a tolerable reduction in the input noise figure at maximum gain.

4. An amplifier as set forth in claim 1 wherein said means to adjust said collector emitter voltage are applied in common mode to said bases.

5. An amplifier as set forth in claim 4 wherein said emitters are connected to a constant current source presenting a high signal and high d.c. impedance.

6. An amplifier as set forth in claim 4 wherein said emitters are connected to a bias stabilizing resistance.

7. The combination set forth in claim 5 wherein said voltage adjusting means comprises:
   a. a pair of transistor buffer amplifiers in base input-emitter follower configuration, the emitters thereof being coupled to separate constant current sources and to the respective bases of said differential amplifier transistors for application of a signal and control potential to said differential amplifier, and
   b. means for applying a common mode control voltage to the bases of the transistors in said buffer amplifier to adjust the emitter voltages therein by emitter follower action and thereby control the collector-emitter voltage of said first pair of transistors for gain control.

8. The combination set forth in claim 7 wherein the signal output is derived from the collectors of said first transistor pair in push-pull, said combination having in addition thereto:
   a. an additional pair of transistors each having base, emitter and collector electrodes connected in differential amplifier configuration,
   b. means for coupling said output signal to the bases of said additional transistor pair in push-pull, and
   c. feedback means including a low pass filter network coupled to the collectors of said additional transistor pair for d.c. coupling a filtered push-pull output signal derived therefrom to the bases of said buffer amplifiers to compensate for d.c. offset in amplification.

9. The combination set forth in claim 8 wherein:
   a. said additional transistor pair is of a conductivity type complementary to said first transistor pair and wherein
   b. said means for applying a common mode control voltage comprises a controllable constant current source connected to the emitters of said additional transistor pair and returned to a potential elevated with respect to the potentials at the base electrodes of said first transistor pair, whereby an increase in current in said controllable current source produces an increasing common mode potential at the collectors of said additional transistor pair, forcing a corresponding increase in the common mode base potentials of the transistors of said buffer amplifier and of said first transistor pair whereby the $V_{ce}$ of said first transistor pair is reduced.

10. The combination set forth in claim 9 having in addition thereto:
   a. a further pair of transistors having base, emitter and collector electrodes connected in differential amplifier configuration, and
   b. a controllable constant current source coupled to the emitters of said further transistor pair arranged to reduce the current therein to produce a reduction in gain in said amplifier as a function of said control voltage.

11. The combination set forth in claim 10 having in addition thereto a pair of nonlinear degenerative impedances for extending the gain control range, one impedance being coupled in each emitter lead of said further pair of transistors, each impedance comprising a diode poled for easy current flow shunted by a resistance having a magnitude providing a marked increase in impedance as the diode becomes nonconductive with decreasing emitter current.

12. The combination set forth in claim 11 having a first and a second pair of buffer amplifiers, one connected into the input and the other connected into the output of said further transistor pair to maintain a flat gain versus frequency response for said amplifier.

* * * * *